United States Patent [19]
Pavio

[11] Patent Number: 4,754,244
[45] Date of Patent: Jun. 28, 1988

[54] DISTRIBUTED BALANCE FREQUENCY MULTIPLIER

[75] Inventor: Anthony M. Pavio, Plano, Tex.

[73] Assignee: Texas Instruments Incorporated, Dallas, Tex.

[21] Appl. No.: 925,421

[22] Filed: Oct. 31, 1986

[51] Int. Cl.[4] ............................................. H03B 19/14
[52] U.S. Cl. .................................. 333/218; 330/286; 363/159
[58] Field of Search ................ 333/218; 363/157, 159; 328/16, 15, 23; 307/271, 529; 330/286, 4.6, 4.9

[56] References Cited

U.S. PATENT DOCUMENTS

| | | | |
|---|---|---|---|
| 4,486,719 | 12/1984 | Ayasli | 330/286 |
| 4,531,105 | 7/1985 | Kumar | 333/218 X |
| 4,660,006 | 4/1987 | Tajima et al. | 333/218 |
| 4,668,920 | 5/1987 | Jones | 330/286 |

Primary Examiner—Gene Wan
Assistant Examiner—Seung Ham
Attorney, Agent, or Firm—Richard K. Robinson; James T. Comfort; Melvin Sharp

[57] ABSTRACT

A distributed balance frequency multiplier has a transmission line that is configured using lumped elements having connection points for inputting signals. Connected to each connection point is the output from a non-inverting amplifier which does not invert a signal applied thereto. A second transmission line is configured also using lumped element techniques and has connection points for receiving an inverted amplified signal whose odd harmonics are 180° to the non-inverting amplified signals. The signal that is to be amplified is carried to both the non-inverting and the inverting amplifier by a third transmission line that also uses lumped elements distribution techniques to create a transmission line. The output of the first transmission line and the second transmission lines are tied together so that the odd harmonics due to the inverting amplification stages cancel and the even harmonics are additive, thereby achieving an effective multiplication of the input signal.

13 Claims, 4 Drawing Sheets 4,754,244

DISTRIBUTED BALANCE FREQUENCY MULTIPLIER

This invention relates to multiplier circuits and in particular to multiplier circuits that operate in the gigahertz band of frequencies and still more particular to a multiplier circuit utilizing distributed amplifier techniques.

BACKGROUND OF THE INVENTION

Frequency multipliers are used in a variety of applications to extend the upper frequency limit of fixed or variable frequency oscillators. However, as the bandwidth of the multiplier approaches an octave, simple circuits become less useful because of the fundamental frequency energy which is present at the multiplier's output port. The problem is typically overcome by using a balanced structure to suppress a fundamental frequency such as transformers and microstrip baluns which also have bandwidth constraints.

SUMMARY OF THE INVENTION

A distributed balance frequency muliplier has a transmission line that is configured using lumped elements having connection points for inputting signals. Connected to each connection point is the output from a non-inverting amplifier which does not invert a signal applied thereto. A second transmission line is configured also using lumped element techniques and has connection points for receiving an inverted amplified signal whose odd harmonics are 180° to the non-inverting amplified signals. The signal that is to be amplified is carried to both the non-inverting and the inverting amplifier by a third transmission line that also uses lumped element distribution techniques to create a transmission line. The output of the first transmission line and the second transmission lines are tied together so that the odd harmonics due to the inverting amplification stages cancel and the even harmonics are additive, thereby achieving an effective multiplication of the input signal.

Each of the transmission lines is terminated into an impedance that is designed to match the characteristic impedance of the transmission line. Using field effect transistor circuits as the amplifier, the lumped elements are simplified because of the inherent capacitance associated with the gates of the field effect transistors. This enables the construction of the transmission line through the use of series connected inductors.

These and other objects and advantages of the invention may become more apparent from reading of the specification in combination with the figures in which:

DETAILED DESCRIPTION OF THE EMBODIMENTS

Figure 1:
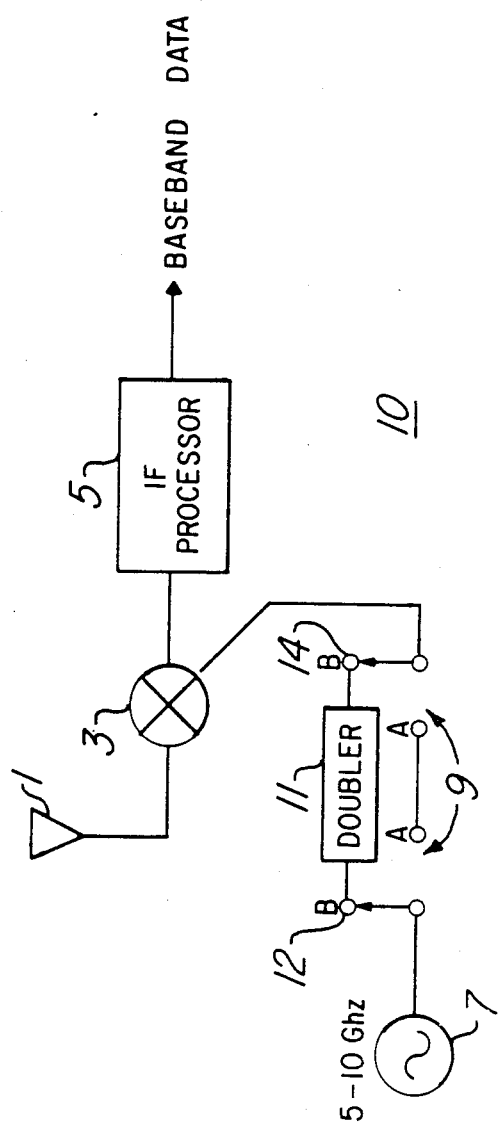
FIG. 1 is a simplified block diagram of a radio receiver using a distributed balance frequency multiplier as a frequency doubler.

In FIG. 1, to which reference should now be made, there is shown a radio receiver 10 that is designed to operate in the frequency band ranging from b 5 to 20 gigahertz. The radio receiver operates by receiving radio signals via an antenna 1 and applying the received radio signals to a mixer 3 which down converts the received radio signals to the IF range and applies the IF range signals it to an IF processor 5 which processes the applied IF signals providing as an output, baseband data. The mixer 3 mixes the received radio signal with a local oscillator signal that is provided by a circuit that includes a local oscillator 7, a double pole double throw switch 9 and a doubler 11.

When the double pole double throw switch 9 is in position A, the output from the local oscillator 7 provides a local oscillator signal to the mixer 3 that can be varied in the range between 5 and 10 gigahertz. However, for receiving radio signals having a carrier frequency greater than 10 gigahertz, then the doubler 11 must be used and this is accomplished by placing the double pole double throw switch 9 to position B. The local oscillator 7 then provides a signal that ranges in the 5 to 10 gigahertz range to the double 11 which doubles the signal and provides a local oscillator signal to the mixer 3 that ranges between 10 and 20 gigahertz, thus, effectively extending the band of operation of the radio receiver 10. The doubler 11 is an embodiment of a distributed multiplier according to the invention.

Figure 2:
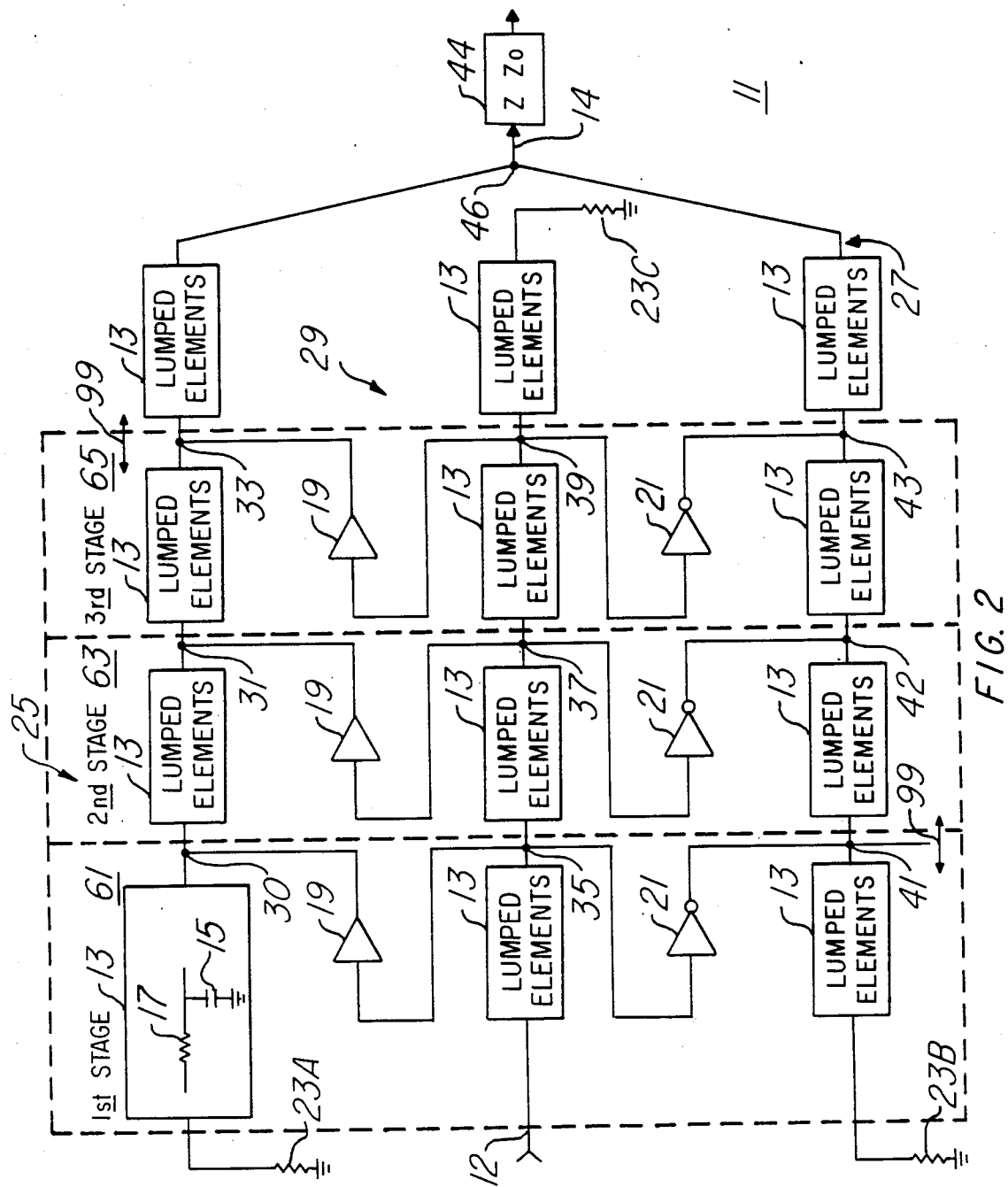
FIG. 2 is a simplified block diagram of a distributed balance frequency multiplier according to the invention.

In the embodiment of FIG. 2, to which reference should now be made, the frequency doubler 11 includes a first transmission line 25. The transmission line 25 is a series connection of lumped elements 13. As in the case of most distributed element networks such as that illustrated in FIG. 2, each lumped element includes a combination of an inductor 17 and capacitor 15. The transmission line is terminated by an impedance 23A which has an impedance equal to the characteristic impedance of the transmission line at the band of frequency to which the doubler 11 is to be operated. This impedance is defined as $Z_o$. A second transmission line N27 is again a series·connection of lumped elements 13 that is terminated by impedance 23B having the characteristic impedance $Z_o$ of the second transmission line. Connected to receive the input from the local oscillator 7 is a third transmission line 29 that also is configured using distributed lumped element techniques and includes a plurality of series connected lumped elements 13 terminated by a resistance 23C having the characteristic impedance $Z_o$ of the third transmission line. Between each pair of lumped elements 13 of the first transmission line 25, second transmission line 27, and third transmission line 29 is a node. At node 35, the local oscillator signal present there is applied to an inverting amplifier 21 and a non-inverting amplifier 19.

Non-inverting amplifier 19 is connected to node 30 of the first transmission line 25 and inverting amplifier 21 is connected to node 41 of the second transmission line 27. At each node, because the system is a distributed lumped element network, the characteristic impedance in each direction from each node is equal to $Z_o$ in the preferred embodiment. Therefore, at node 30 an non-inverting amplified signal is applied to the first transmission line 25 and at node 41 an inverted amplified signal of the node that is present at 35 is applied thereto.

Because the circuit just described is repeated in a similar fashion at each set of nodes, then the circuits can be identified as a series connection of stages shown by dotted blocks as a first stage 61, a second stage 63 and a third stage 65. The second stage input to the first transmission line 25 is at node 31 and the third stage input is at node 33. In a similar fashion, the inverted input is at node 42 of the transmission line 27 for the second stage and the third stage is at node 43. Node 37 provides the input signal to the non-inverting amplifier 19 of the second stage 63 and the inverting amplifier 21 also of the second stage 63, whereas node 39 provides the input signal to the non-inverting amplifier 19 and the inverting amplifier 21 of the third stage 65. At node 46, under ideal conditions where the gain of the amplifier 19 is equal to the gain of the amplifier 21, the signals that are present on the first transmission line 25 and the signals that are present on the second transmission line 27 are vectorally combined. Because the odd harmonics of the signal that is applied to the amplifiers 21 have been phase shifted 180° and the even harmonics have been phase shifted 360°, then at node 46, the odd harmonics cancelled and the even harmonics add to provide a multiplication of frequency of the output from the oscillator 7. The output transmission line 14 for optimum operation has a characteristic frequency to $2Z_o$ as is illustrated by block 44.

Figure 3:
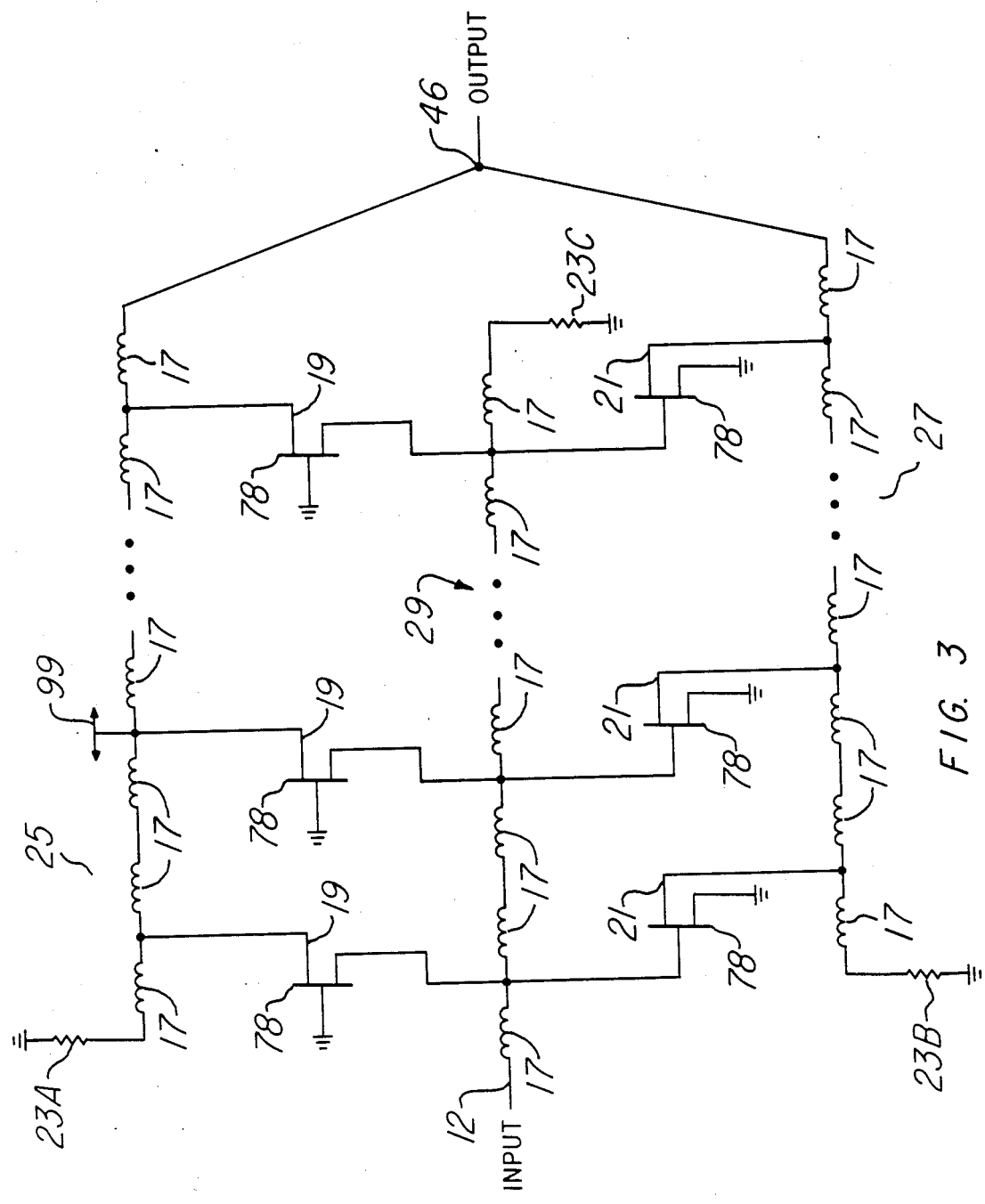
FIG. 3 is a schematic diagram of a distributed balance frequency multiplier according to the invention.

FIG. 3 is a schematic diagram of a distributed balance frequency multiplier according to the invention in which each transmission line 25, 27 includes a series connection of inductors 17 and 17'. In the preferred embodiment, the circuit of FIG. 3 is implemented as a single substrate using GaAs technology. The non-inverting amplifier 19 is a common gate field effect transistor circuit using a field effect transistor 78 whereas the inverting amplifier 21 is a common source field effect transistor using a second field effect transistor 78. The embodiment shown in FIG. 3 is a multi stage circuit in which the number of stages is determined by the desired gain of the output and the bandwidth. The more stages that are used, the narrower the bandwidth, but the higher the gain. Therefore, these elements are considered when designing a multiplier according to the invention.

Figure 4:
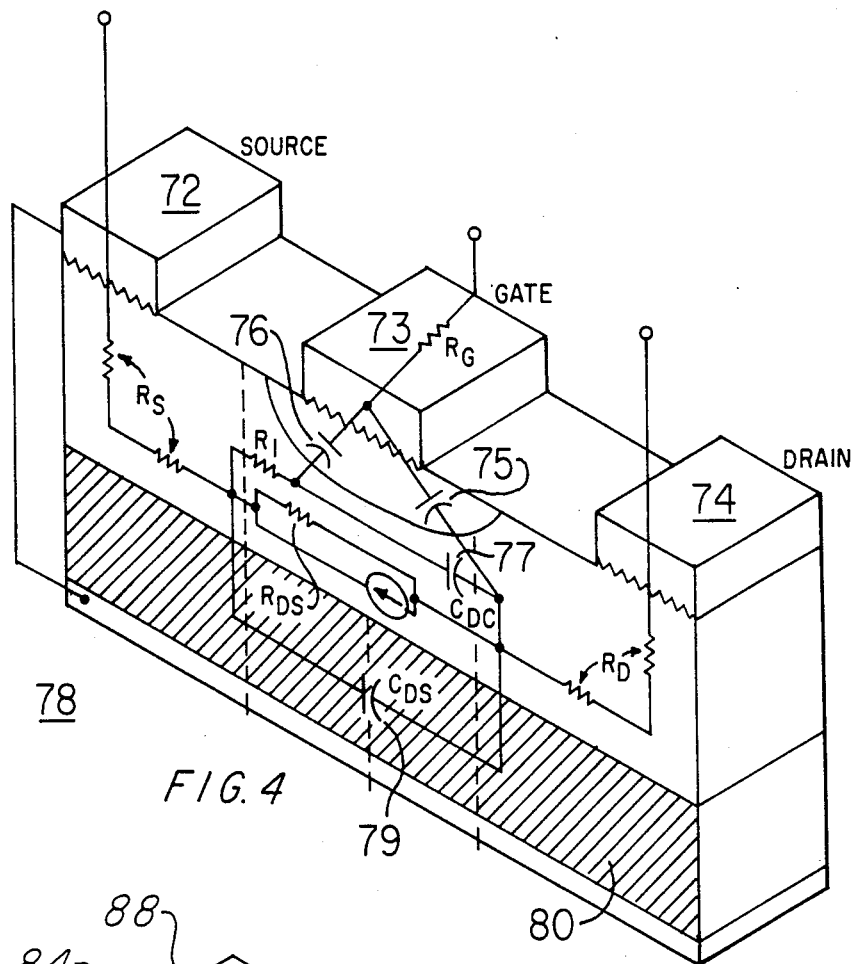
FIG. 4 is a diagram of a field effect transistor illustrating the internal capacitance.
Figure 5:
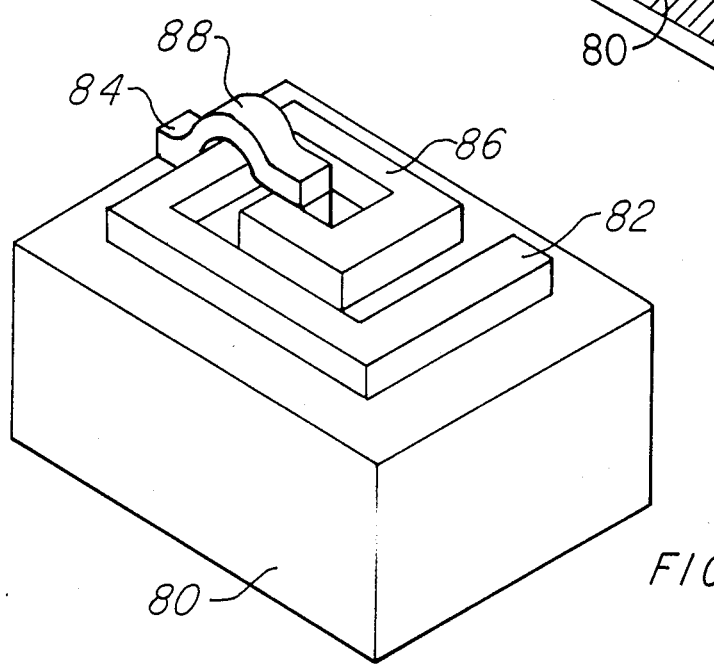

The capacitance elements for the embodiment is FIG. 3 is provided by the internal capacitance of the field effect transistor 78 which is shown in FIG. 4. Capacitors 75, 76 and 77 are the gate capacitance for the gate of the field effect transistor 78 and capacitance 79 is the drain to source capacitance which comes into play in the common source circuit 21 shown in FIG. 3.

The size of the inductors are selected based on the impedance presented by the internal capacitance of the gates of the field effect transistor 78 and the inductors 17 and 17' to provide an impedance of $Z_o$ in each direction as is indicated by arrows 99 at each node.

For the embodiment of FIG. 3 manufactured on GaAs the following characteristics were achieved:

Inductor 17 or (17'+17')≅0.5 nano Henry
Stages=4
Bandwidth=1:18
Gate Capacitance≅0.27 pico farads

I claim:

1. A distributed balanced frequency multiplier comprising:
   a first plurality of lumped elements arranged as a first transmission line with a plurality of noninverting connection points distributed there along;
   a plurality of noninverting amplifiers with each single noninverting amplifier having a noninverting input and a noninverting output connected to a predetermined noninverting connection point;
   a second plurality of lumped elements arranged as a second transmission line with a plurality of inverting connection points distributed therealong;
   a plurality of inverting amplifiers with each single inverting amplifier having an inverting input and an inverting output connected to a predetermined inverting connection point;
   a third plurality of lumped elements arranged as a third transmission line with a plurality of input connection points distributed therealong with each single input connection point having a predetermined noninverting input and a predetermined inverting input connected thereto; and
   a tie point to which a first end of the first transmission line and a first end of the second transmission line are connected.

2. The distributed balanced frequency multiplier according to claim 1 further comprising:
   a first termination impedance connected to a second end of the first transmission line;
   a second termination impedance connected to a second end of the second transmission line; and
   a third termination impedance connected to first end of the third transmission line.

3. The distributed balanced frequency multiplier according to claim 1 wherein the each single noninverting amplifier comprises:
   a common gate field effect transistor circuit.

4. The distributed balanced frequency multiplier according to claim 1 wherein the each single inverting amplifier comprises:
   a common source field effect transistor circuit.

5. The distributed balanced frequency multiplier according to claim 1 wherein each single noninverting amplifier and each single inverting amplifier are field effect transistor circuits and each single lumped element of the first, second and third plurality of lumped elements comprises:
   an inductor having at least one end connected to a gate of the field effect transistor circuit having an internal capacitance.

6. The distributed balanced frequency multiplier according to claim 1 further comprising:
   a signal source connected to a first end to the third transmission line.

7. The distributed balanced frequency multiplier according to claim 6 wherein the each single noninverting amplifier comprises:
   a common gate field effect transistor circuit.

8. The distributed balanced frequency multiplier according to claim 6 wherein the each single inverting amplifier comprises:
   a common source field effect transistor circuit.

9. The distributed balanced frequency multiplier according to claim 6 wherein each single noninverting amplifier and each single inverting amplifier are field effect transistor circuits and each single lumped element of the first, second and third plurality of lumped elements comprises:
   an inductor having at least one end connected to a gate of the field effect transistor circuit having an internal capacitance.

10. The distributed balanced frequency multiplier according to claim 6 further comprising:

a first termination impedance connected to a second end of the first transmission line;

a second termination impedance connected to a second end of the second transmission line; and a third termination impedance connected to a second end of the third transmission line.

11. A distributed balanced frequency multiplier comprising:

a first transmission line with characteristic impedances favorable for transmitting noninverted output signals within a first band of frequencies and distributed along the first transmission line is a plurality of noninverted connection points for inputting noninverted output signals to the first transmission line;

a plurality of noninverting amplifier means for providing the noninverted output signals and each single noninverting amplifier means includes; a noninverting input and a noninverted output, the noninverted output being connected to a predetermined noninverted connection point and each single noninverting amplifier means being for amplifying an input signal applied to the noninverting input while maintaining a zero degree phase shift between the input signal and noninverted output signal provided thereby on the inverted output;

a second transmission line with characteristic impedances favorable for transmitting inverted output signals within the first band of frequencies and distributed along the second transmission line is a plurality of inverted connection points for inputting inverted output signals to the second transmission line;

a plurality of inverting amplifiers means for providing the inverted output signals and each single inverting amplifier means includes; an inverting input and an inverted output, the inverted output being connected to a predetermined inverted connection point, each single inverting amplifier being for amplifying the input signal applied to the inverting input while maintaining a hundred eighty degree phase shift between odd harmonics of the input signal and the inverted output signal provided thereby on the inverted output;

a third transmission line for transmitting the input signal to the inverting inputs and noninverting inputs of the plurality of inverting and noninverting amplifiers; and combining means for combining the inverted output signal with the noninverted output signal to obtain a multiplied signal, the combining means being connected to a first end of the first transmission line and a first end of the second transmission line and the multiplied signal being the vectorial combination of the inverted signal and the noninverted signal.

12. The distributed balanced frequency multiplier according to claim 11 further comprising:

means for terminating the first, second and third transmission lines.

13. The distributed balanced frequency multiplier according to claim 11 further comprising:

signal generation means operatively to the third transmission line for generating the input signal.

* * * * *